(12) United States Patent
Lee et al.

(10) Patent No.: US 8,592,237 B2
(45) Date of Patent: Nov. 26, 2013

(54) METHOD OF MANUFACTURING A THIN FILM TRANSISTOR INCLUDING FORMING BUS LINE PATTERNS IN A SUBSTRATE AND FILLING WITH METAL

(75) Inventors: Jungil Lee, Goyang-si (KR); Injae Chung, Gwacheon-si (KR); Joonyoung Yang, Bucheon-si (KR); Gisang Hong, Gwangju-si (KR)

(73) Assignee: LG Display Co., Ltd., Seoul (KR)

( * ) Notice: Subject to any disclaimer, the term of this patent is extended or adjusted under 35 U.S.C. 154(b) by 74 days.

(21) Appl. No.: 13/156,809

(22) Filed: Jun. 9, 2011

(65) Prior Publication Data

US 2012/0007091 A1 Jan. 12, 2012

(30) Foreign Application Priority Data

Jul. 7, 2010 (KR) .......................... 10-2010-0065239

(51) Int. Cl.
 *H01L 21/00* (2006.01)
(52) U.S. Cl.
 USPC ................. 438/34; 438/42; 438/44; 438/159; 438/589; 438/30; 257/59; 257/72; 257/E21.535
(58) Field of Classification Search
 USPC ........................................... 257/153, 141, 59
 See application file for complete search history.

(56) References Cited

U.S. PATENT DOCUMENTS

| 5,453,856 | A | * | 9/1995 | Kim ............................... 349/140 |
| 7,166,502 | B1 | | 1/2007 | Kwon | |
| 7,576,821 | B2 | * | 8/2009 | Lee et al. ...................... 349/141 |
| 8,223,283 | B2 | * | 7/2012 | Lee et al. ......................... 349/39 |
| 2004/0189919 | A1 | | 9/2004 | Ahn et al. | |
| 2006/0208624 | A1 | | 9/2006 | Yoshimoto | |
| 2007/0032036 | A1 | | 2/2007 | Wang et al. | |
| 2007/0263166 | A1 | * | 11/2007 | Ahn et al. ...................... 349/187 |
| 2009/0166635 | A1 | * | 7/2009 | Kim et al. ........................ 257/59 |
| 2010/0273285 | A1 | * | 10/2010 | Wang et al. ..................... 438/34 |

FOREIGN PATENT DOCUMENTS

| KR | 10-2001-0046141 A | 6/2001 |
| KR | 10-2007-0061618 A | 6/2007 |
| KR | 10-2008-0001902 A | 1/2008 |
| KR | 10-2009-0100186 A | 9/2009 |

* cited by examiner

*Primary Examiner* — Marcos D. Pizarro
*Assistant Examiner* — Cesar Lopez
(74) *Attorney, Agent, or Firm* — McKenna Long & Aldridge LLP

(57) ABSTRACT

A method for manufacturing a thin film transistor substrate including forming bus lines by etching a surface of a substrate to form bus line patterns and filling the bus line patterns with a bus line metal; forming a semiconductor channel layer at one portion of a pixel area defined by the bus lines; and forming source-drain electrodes on the semiconductor channel layer, a pixel electrode extending from the drain electrode within the pixel area, and a common electrode parallel with the pixel electrode. The bus lines are formed as being thicker but the bus lines are buried in the substrate so that the line resistance can be reduced and the step difference due to the thickness of bus line does not affect the device.

10 Claims, 6 Drawing Sheets

METHOD OF MANUFACTURING A THIN FILM TRANSISTOR INCLUDING FORMING BUS LINE PATTERNS IN A SUBSTRATE AND FILLING WITH METAL

This application claims the benefit of Korean Patent Application No. 10-2010-0065239 filed on Jul. 7, 2010, which is incorporated herein by reference for all purposes as if fully set forth herein.

BACKGROUND OF THE INVENTION

1. Field of the Invention

The present disclosure relates to a thin film transistor (or "TFT") substrate having a low resistance bus line structure and a method for manufacturing the same. Particularly, the present disclosure relates to a TFT substrate having a thick bus line buried in a substrate having a low resistance bus line structure and a method for manufacturing the same.

2. Discussion of the Related Art

Various flat panel display devices are developed to overcome many drawbacks of the cathode ray tube such as heavy weight and bulky volume. The flat panel display devices include the liquid crystal display device (or LCD), the field emission display (or FED), the plasma display panel (or PDP) and the electroluminescence device (or ED).

Flat panel display devices such as the liquid crystal display device or the organic light emitting diode display device have the substrate including a plurality of TFTs for using as the active display devices. FIG. 1 is a plane view illustrating the structure of the thin film transistor substrate used in the horizontal electric field type liquid crystal display device according to the related art. FIGS. 2A to 2E are cross-sectional views illustrating the steps of manufacturing the thin film transistor substrate of FIG. 1 by cutting along the line I-I', according to the related art.

Referring to FIG. 1 and FIGS. 2A to 2E, the thin film transistor substrate of the LCD has a gate line GL and a data line DL crossing each other with a gate insulating layer GI therebetween on a glass substrate SUB, and a thin film transistor TFT formed at each cross section of the gate line GL and the data line DL. The crossing structure of the gate line GL and the data line DL defines a pixel area. Further included are a pixel electrode PXL and a common electrode COM for forming a horizontal electric field therebetween in the pixel area, and a common line CL connected to the common electrode COM on the substrate SUB. The gate line GL supplies the gate signal to the gate electrode G of the thin film transistor TFT. The data line DL supplies the pixel signal to the pixel electrode PXL via the drain electrode D of the thin film transistor TFT. The common line CL is formed in parallel with the gate line GL between the pixel areas and supplies a reference voltage for driving the liquid crystal to the common electrode COM.

Responding to the gate signal supplied to the gate line GL, the thin film transistor TFT can charge the pixel signal from the data line DL to pixel electrode PXL, and maintain the pixel signal on the pixel electrode PXL. The pixel electrode PXL is formed within the pixel area by being connected to the drain electrode D of the thin film transistor TFT. The common electrode COM is also formed within the pixel area by being connected to the common line CL. Particularly, the pixel electrode PXL and the common electrode COM are disposed parallel to each other in the pixel area. For example, the common electrode COM has a plurality of vertical segments which are separatedly disposed a predetermined distance from each other. The pixel electrode PXL has a plurality of vertical segments in which each segment is disposed between the segments of the common electrode COM.

At one end portion of each gate line GL and each data line DL, a gate pad GP and a data pad DP are formed, respectively. The gate pad GP and the data pad DP are connected to a gate pad terminal GPT and a data pad terminal DPT through a gate pad contact hole GPH and a data pad contact hole DPH, respectively.

Referring to FIGS. 2A to 2E again, the method for manufacturing the thin film transistor substrate according to the related art will be explained, hereinafter.

A gate metal is deposited on a substrate SUB. The gate elements are formed by patterning the gate metal using the first mask process. As shown in FIG. 2A, the gate elements include a plurality of gate lines GL extending in a horizontal direction, the gate electrode G branching from the gate line GL, and a gate pad GP formed at one end of the gate line GL. As the thin film transistor substrate is for the horizontal electric field type, the common line CL disposed in parallel to the gate line GL is further included.

A gate insulating layer GI such as silicon nitride (SiNx) or silicon oxide (SiOx) is deposited on the whole surface of the substrate SUB having the gate elements. After that, a semiconductor material such as amorphous silicon and an impurity dopped semiconductor material such as n+ dopped silicon are sequentially deposited thereon. By patterning the impurity dopped semiconductor material and the semiconductor material using the second mask process, a semiconductor channel layer A and an ohmic layer n are formed, as shown in FIG. 2B. The semiconductor channel layer A and the ohmic layer n overlap with the gate electrode G having the gate insulating layer GI therebetween.

A source-drain metal is deposited on the substrate SUB having the semiconductor channel layer A and the ohmic layer n. By patterning the source-drain metal using the third mask process, the source-drain elements are formed. As shown in FIG. 2C, the source-drain elements include the data line DL extending in vertical direction to cross with the gate line GL, a data pad DP formed at one end of the data line DL, the source electrode S branching from the data line DL and overlapping with one side of the gate electrode G, and the drain electrode D facing with the source electrode S and overlapping with the other side of the gae electrode G. Particularly, the source electrode S contacts one portion of the ohmic layer n to overlap with one side of the semiconductor channel layer A and the gate electrode G. The drain electrode D contacts anther portion of the ohmic layer n to overlap with the other side of the semiconductor channel layer A and the gate electrode G. Further etching the ohmic layer n using the source-drain elements as a mask, the portions of the ohmic layer n exposed between the source electrode S and the drain electrode D are removed so that the semiconductor channel layer A is exposed between the source electrode S and the drain electrode D. Consequently, the thin film transistor TFT including the source electrode S, the drain electrode D, the semiconductor channel layer A, and the gate electrode G is completed.

On the whole surface of the substrate SUB having the source-drain elements, a passivation layer PAS is formed by depositing an insulating material such as silicon nitride (SiNx) or silicon oxide (SiOx). As shown in FIG. 2D, by patterning the passivation layer PAS using a fourth mask process, a data pad contact hole DPH exposing some portions of the data pad DP and the drain contact hole DH exposing some portions of the drain electrode D are formed. At the same time, by patterning the passivation layer PAS and the gate insulating layer GI, a gate pad contact hole GPH exposing some portions of the gate pad GP and a common contact hole CH exposing some portions of the common line CL are formed.

A transparent conductive material such as ITO (Indium Tin Oxide) or IZO (Indium Zinc Oxide) is deposited on the passivation layer PAS having the contact holes GPH, DH, DPH and CH. By patterning the transparent conductive material using a fifth mask process, the pixel electrode PXL, the common electrode COM, the gate pad terminal GPT and the data pad terminal DPT are formed, as shown in FIG. 2D. The pixel electrode PXL contacts the drain electrode D through the drain contact hole DH, and has a plurality of segments disposed in parallel within the pixel area. The common electrode COM contacts the common line CL through the common contact hole CH, and has a plurality of segments disposed in parallel within the pixel area. The pixel electrode PXL and the common electrode COM are disposed parallel to each other with a predetermined distance therebetween. The gate pad terminal GPT contacts the gate pad GP through the gate pad contact hole GPH, and the data pad terminal DPT contacts the data pad DP through the data pad contact hole DPH.

The LCD according to the related art explained above has a problem regarding a large display area. Typically, as the area of the thin film transistor substrate increases, the gate line and the data line become longer. As the bus lines become longer, even though the resistivity of the bus line material is not changed because it is the property of the material, the resistance of the bus line becomes larger. The resistance of the bus line is defined by the following Equation 1.

$$R = \rho \frac{L}{S}$$ [Equation 1.]

Here, R is the resistance of the bus line, $\rho$ is the resistivity of the bus line material, L is the length of the bus line, and S is the cross-sectional area of the bus line.

That is, as the thin film transistor substrate becomes larger, the length L will be longer so that the resistance is higher. As the resistance is becomes higher, the signal passing through the bus line can be delayed. As a result, the display device has video quality problems. To solve these problems, the resistance of the bus line should be kept at a minimum. To keep the resistance of the bus line at a minimum, the cross-sectional may be increased, or the bus line material can be selected as having a lower resistivity. To select a material having a lower resistivity is very difficult because the material is limited. Furthermore, it is even possible that when the bus line becomes longer, the resistance will increase. Therefore, the best solution to minimize the resistance of the bus line is to enlarge the cross-sectional area of the bus line.

There may be two methods to increase the cross-sectional area of the bus line; one is to increase the width of the bus line, the other is to increase the thickness of the bus line. For one example, by enlarging the width of the gate bus line and/or data bus line, it is possible to prevent the resistance of the bus line from increasing. However, as the width of the bus lines defining the boundaries of the pixel area is increased, the effective pixel area should be reduced. In that case, the aperture ratio of the display area is also reduced and that causes poor display quality. For another example, by enlarging the thickness of the bus lines, the etching tact time should be longer when forming the bus lines and the space between the bus lines should be increased. This can cause the problem of a lowered aperture ratio. Furthermore, in increasing the thickness of the bus line, the step difference between the bus line and other layer can be enlarged. This causes the defects in the rubbing process of the alignment layer.

Consequently, in the thin film transistor substrate for the large diagonal area flat panel display device, the bus line structure ensuring low resistance of the bus line is an important requirement.

SUMMARY OF THE INVENTION

In order to overcome the above mentioned drawbacks, the purpose of the present disclosure is to suggest a thin film transistor substrate having a low resistance bus line structure for large area flat panel display devices and a method for manufacturing the same. Another purpose of the present disclosure is to suggest a thin film transistor substrate having a low resistance bus line structure in which the bus line thickness is increased but the step difference with the other layer is not increased, and a method for manufacturing the same. Still another purpose of the present disclosure is to suggest a thin film transistor substrate having a low resistance bus line structure in which the bus line thickness is increased and the width of the bus line is decreased to improve the aperture ratio, and a method for manufacturing the same.

In order to accomplish the above, the present disclosure suggests a method for manufacturing a thin film transistor substrate comprising: forming bus lines by etching a surface of a substrate to form bus line patterns and filling the bus line patterns with a bus line metal; forming a semiconductor channel layer at one portion of a pixel area defined by the bus lines; and forming source-drain electrodes on the semiconductor channel layer, a pixel electrode extending from the drain electrode within the pixel area, and a common electrode parallel with the pixel electrode.

Forming the bus lines includes: depositing a photoresist on the substrate; patterning the photoresist using a mask corresponding to the bus line patterns; etching the surface of the substrate using the patterned photoresist to form the bus line patterns to the substrate; depositing the bus line metal on the photoresist and filling the bus line metal in the bus line patterns; and removing the photoresist with the bus line metal on the photoresist.

Forming the bus lines includes forming a gate line extending in one direction on the substrate, a common line extending parallel with the gate line, a data line having a plurality of segments extending in the other direction perpendicular to the gate line between the gate line and the common line, and a gate electrode branching from the gate line to the pixel area.

Forming a semiconductor channel layer includes: forming the semiconductor channel layer overlapping with the gate electrode, by sequentially depositing an insulating material, a semiconductor material and an impurity dopped semiconductor material and patterning the impurity dopped semiconductor material and the semiconductor material; and forming a gate pad contact hole exposing the gate pad, a data pad contact hole exposing the data pad, a common line contact hole exposing some portions of the common line, and data line contact holes exposing both ends of the segments of the data line, by sequentially patterning the insulating material.

Forming the source-drain electrodes, the pixel electrode and the common electrode includes: depositing and patterning a source-drain metal on the substrate having the semiconductor channel layer to form the source electrode on one side of the semiconductor channel layer, the drain electrode facing with the source electrode on the other side of the semiconductor channel layer, the pixel electrode extending from the drain electrode and having a plurality of segments disposed in parallel in the pixel area, the common electrode connecting to the common line via the common line contact hole and having a plurality of segments disposed in parallel in the pixel area; and further to form a gate pad terminal contacting the gate pad via the gate pad contact hole, a data pad terminal contacting the data pad via the data pad contact hole, and a data line connecting terminal connecting to neighboring segments of the data line via the data line contact holes.

The method further comprises forming a passivation layer exposing the gate pad terminal and the data pad terminal by depositing and patterning a passivation material on the substrate having the source-drain electrodes, the pixel electrode and the common electrode.

The source-drain metal is deposited by sequentially depositing a first metal layer and a second metal layer, and the passivation layer is further patterned corresponding to the pixel area to expose the pixel electrode and the common electrode; and further comprises: removing the second metal layers of the gate pad terminal, the data pad terminal, the pixel electrode and the common electrode.

In addition, the present disclosure suggests a thin film transistor substrate having a low resistance bus line structure comprising: a substrate; bus line patterns recessed into the substrate with a predetermined depth; bus lines filling into the bus line patterns; a gate insulating layer covering the bus lines; a thin film transistor disposed at one portion of a pixel area defined by the bus lines; a pixel electrode connecting to the thin film transistor and having a plurality of segments parallel to each other in the pixel area; and a common electrode including a plurality of segments parallel with the segments of the pixel electrode in the pixel area.

The bus lines include a gate line extending in one direction on the substrate, a common line extending parallel with the gate line, a data line having a plurality of segments extending in the other direction perpendicular to the gate line between the gate line and the common line; and the thin film transistor includes a gate electrode branching from the gate line, a semiconductor channel layer overlapping with the gate electrode, a source electrode connecting to one side of the semiconductor channel layer, and a drain electrode facing with the source electrode and connecting to the other side of the semiconductor channel layer.

The device further comprises: a gate pad formed at one end of the gate line, a gate pad contact hole exposing the gate pad, and a gate pad terminal contacting to the gate pad via the gate pad contact hole; a data pad formed at one end of the data line, a data pad contact hole exposing the data pad, and a data pad terminal contacting to the data pad via the data pad contact hole; and data line contact holes exposing both ends of the segments of the data line, and a data line connecting terminal connecting to neighboring segments of the data line via the data line contact holes.

The device further comprises: a passivation layer on the substrate exposing the gate pad terminal, the data pad terminal, the pixel electrode and the common electrode.

The source electrode and the drain electrode include a first metal layer having at least one of molibdenium, titanium and molibdenium-titanium alloy and a second metal layer having copper, and the exposed gate pad terminal, the data pad terminal, the pixel electrode and the common electrode include a first metal layer only.

In the thin film transistor substrate for the flat panel display device according to the present disclosure, the bus lines are formed thicker than those of related art, but the bus lines are buried in the substrate. Therefore, the cross-sectional area of the bus lines can be larger than that of the related art, and the resistance of the bus lines can be reduced or maintained in lower state. Furthermore, as the thick bus lines are buried into the substrate, there is no high step difference between the bus lines and other layers, so that the thicker bus line cannot cause any negative effect to the thin film transistor structure. As the resistance of the bus line is maintained in a low state, it is possible to make the width of the bus line narrow and the length of the bus line longer. As a result, the present disclosure includes a thin film transistor substrate for large area flat panel display device with an improved aperture ratio.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
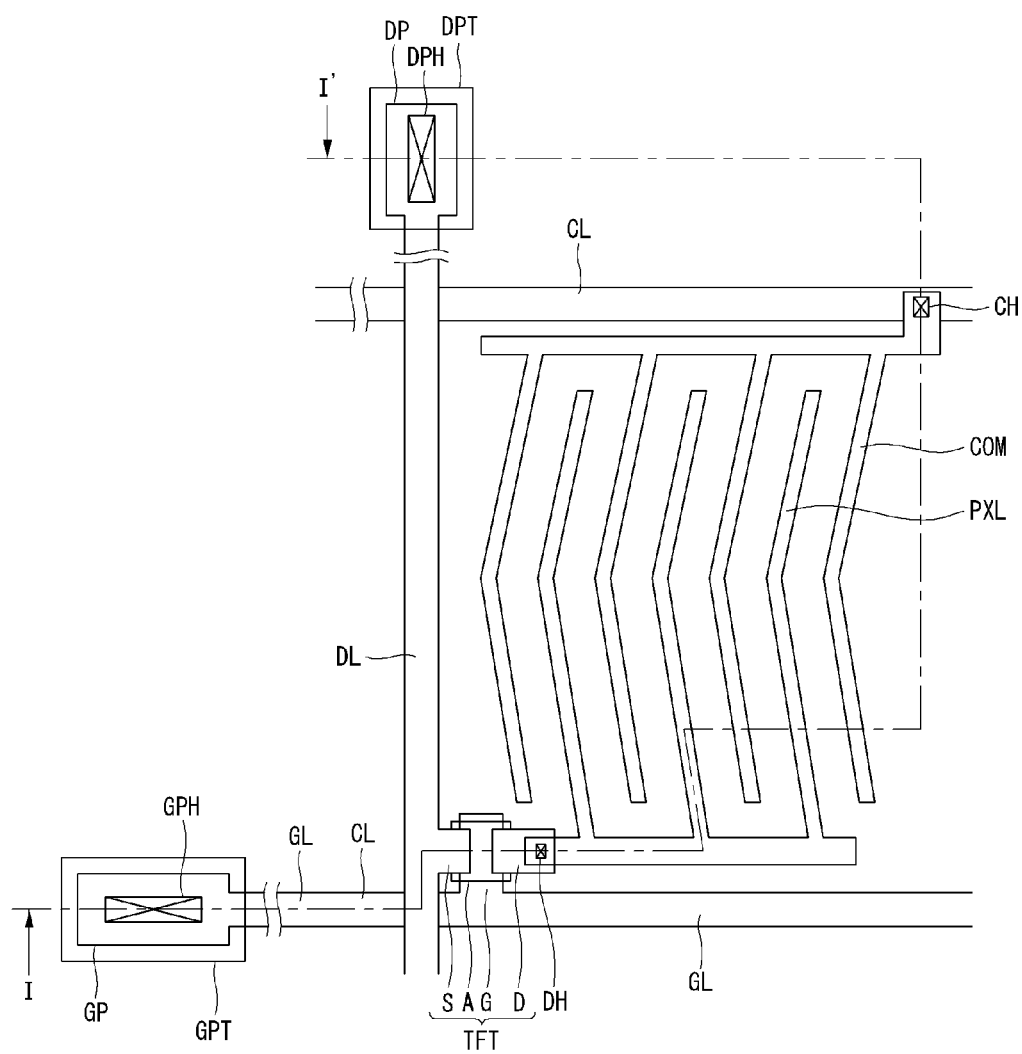
FIG. 1 is a plane view illustrating the structure of the thin film transistor substrate used in the horizontal electric field type liquid crystal display device according to the related art.
Figure 2A:
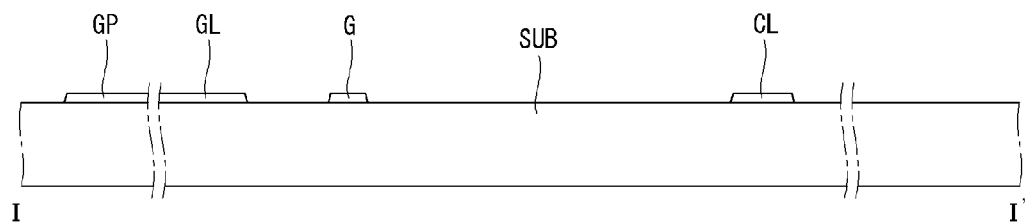
FIGS. 2A to 2E are cross-sectional views illustrating the steps of manufacturing the thin film transistor substrate of FIG. 1 by cutting along the line I-I', according to the related art.
Figure 2B:
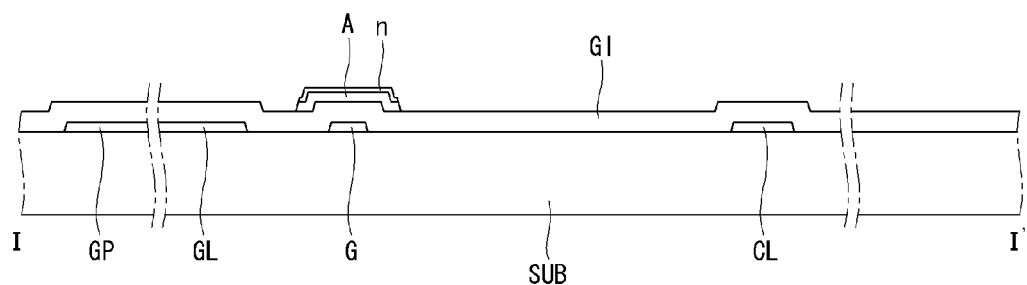
Figure 2C:
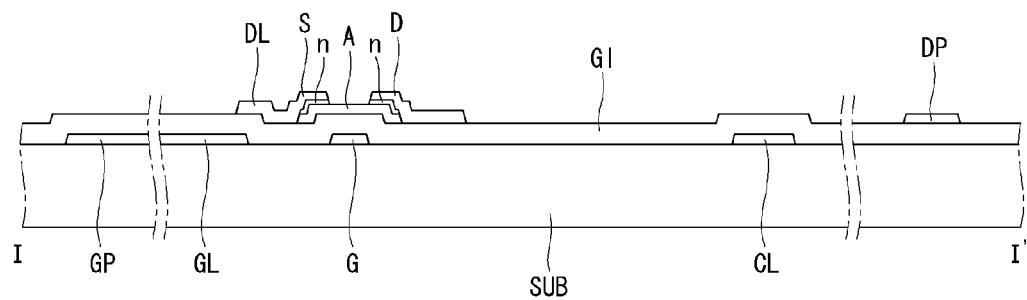
Figure 2D:
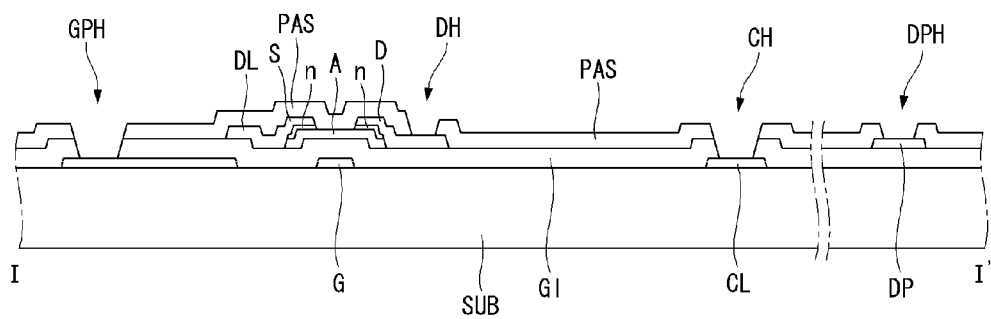
Figure 2E:
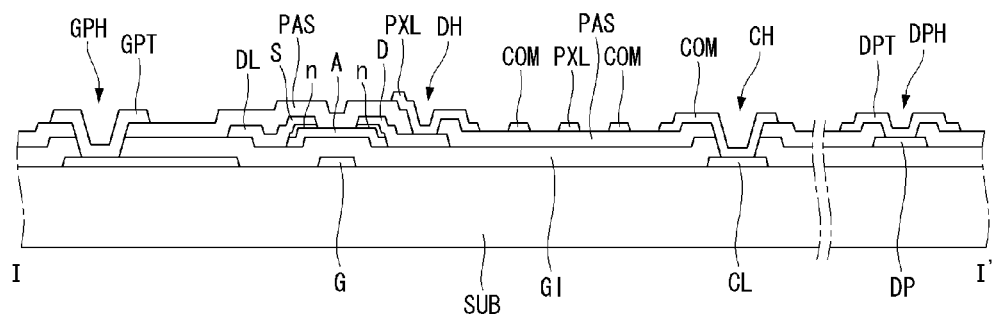
Figure 3:
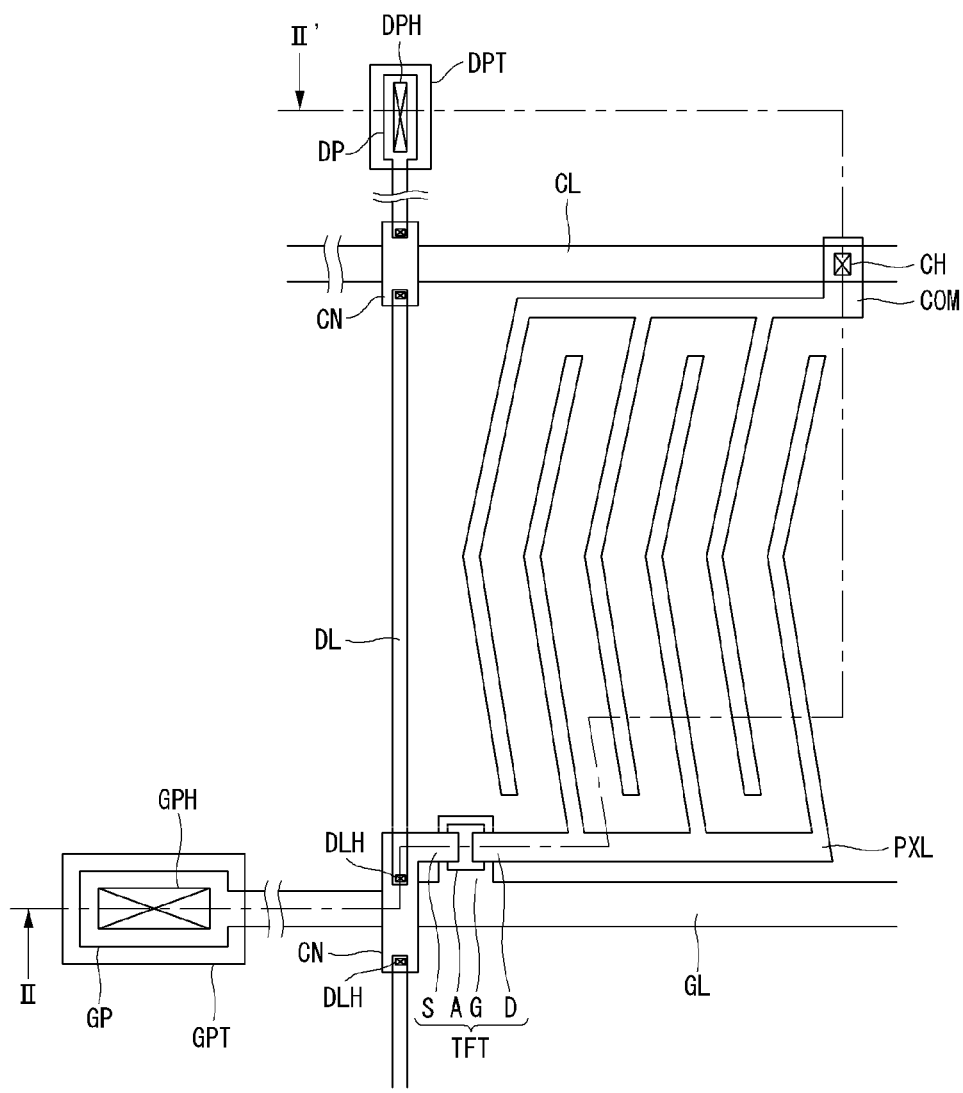
FIG. 3 is a plane view illustrating the structure of a thin film transistor substrate having a low resistance bus line structure used in a horizontal electric field type liquid crystal display device according to the present disclosure.

Referring to attached figures including FIG. 3 and FIGS. 4A to 4E, we will explain preferred embodiments of the present disclosure. FIG. 3 is a plane view illustrating the structure of a thin film transistor substrate having a low resistance bus line structure used in a horizontal electric field type liquid crystal display device according to the present disclosure. FIGS. 4A to 4E are cross-sectional views illustrating the steps of manufacturing for the thin film transistor substrate having a low resistance bus line structure of FIG. 3 by cutting along the line II-II', according to present disclosure.

Referring to FIG. 3 and FIGS. 4A to 4E, the thin film transistor substrate for an LCD comprises a gate line GL and a data line DL which are crossing each other with a gate insulating layer therebetween on a glass substrate SUB, and a thin film transistor TFT formed at the crossing portion of the gate line GL and the data line DL. The crossing gate line GL and the data line DL define a pixel area. Further included are a pixel electrode PXL and a common electrode COM for forming a horizontal electric field therebetween in the pixel area, and a common line CL connected to the common electrode COM on the substrate SUB. The gate line GL supplies the gate signal to the gate electrode G of the thin film transistor TFT. The data line DL supplies the pixel signal to the pixel electrode PXL via the drain electrode D of the thin film transistor TFT. The common line CL is formed between the pixel areas, is parallel with the gate line GL, and supplies a reference voltage signal for driving the liquid crystal molecules to the common electrode COM.

Responding to the gate signal supplied to the gate line GL, the thin film transistor TFT can charge the pixel signal from the data line DL to pixel electrode PXL, and maintain the pixel signal on the pixel electrode PXL. The pixel electrode PXL is formed within the pixel area by being connected to the drain electrode D of the thin film transistor TFT. The common electrode COM is also formed within the pixel area by being connected to the common line CL. Particularly, the pixel electrode PXL and the common electrode COM are disposed parallel each other in the pixel area. For example, the common electrode COM has a plurality of vertical segments (or vertical chevron segments) which are separatedly disposed with a predetermined distance between each other. The pixel electrode PXL has a plurality of vertical segments (or vertical chevron segments) in which each segment is disposed between the segments of the common electrode COM.

At one end portion of each gate line GL and each data line DL, a gate pad GP and a data pad DP are formed, respectively. The gate pad GP and the data pad DP are connected to a gate pad terminal GPT and a data pad terminal DPT through a gate pad contact hole GPH and a data pad contact hole DPH, respectively.

Particularly, in the present disclosure, in order to reduce the resistance of the gate line GL and the common line CL and to prevent the aperture ratio from being lowered, the gate line GL and the common line CL are formed to have a thicker thickness than the related art. Furthermore, in order not to have high level difference between the thick bus lines GL and CL and the substrate SUB, bus grooves having a depth corresponding to the thickness of the bus lines are formed into the substrate SUB and the bus lines are formed by filling the bus grooves.

Furthermore, the data line DL disposed crossing the gate line GL and the common line CL also has the same structure. In that case, the data line DL has a plurality segments which are disposed between the gate lines GL and the common lines CL. In addition, these neighboring segments are electrically connected to each other using data line connection terminals CN formed on the gate insulating layer GI via a data line contact hole DLH.

Referring to FIGS. 4A to 4E again, the method for manufacturing the thin film transistor substrate according to the related art will be explained, hereinafter.

Using a first mask process, recessed grooves for the gate line GL, the common line CL and the data line DL are formed by etching the surface of the glass substrate SUB. The etching depth of the glass substrate SUB may correspond to the thickness of the lines GL, CL and DL. In the present disclosure, the width of the lines GL, CL and DL are substantially same with those of the related art. Further preferably, the width of the gate line GL, the common line CL and the data line DL may be narrower than that of the related art. The most important thing is to make the bus lines have a low resistance. Therefore, to reduce the line resistance of the gate line GL, the common line CL and the data line DL, the cross-sectional area of the lines should be larger than that of the related art. In the present disclosure, the thickness of the bus lines can preferably be twice as thick as that of the related art, at least.

For example, when the width of the lines is substantially same with that of the related art, the thickness of the lines can be twice that of the related art. Then, the cross-sectional area of the line will be two times that of the related art. According to Equation 1, when the cross-sectional area is twice as big, the resistance of line will be the same even though the line length is twice as long. That is, by having double thickness, it is possible to elongate the line up to twice the length. The surface area of the thin film transistor substrate for the flat panel display device can be large but the line resistance can be maintained in the same state.

For another example, when the width of line can be one half (50%) that of the related art, the cross-sectional area of the line will be half that of the related art. In this case, according to the present disclosure, the line can be twice as thick. Then, the cross-sectional area of the line will be same as the related art. In order to have a larger cross-sectional area than the related art, the thickness of the line can be three times that of the related art. Then, according to the Equation 1, the cross-sectional area of the line will be 1.5 times that of the related art. That is, by increasing the thickness of the line up to three times than the related art, it is possible to reduce the width of the line in half of the related art and to elongate the length of the line to 1.5 times that of the related art, while having the same line resistance. As a result, the surface area of the thin film transistor substrate for flat panel display device can be large and the aperture ratio can be improved without any video quality problem, because the line resistance is not increased.

Consequently, according to the present disclosure, the thin film transistor substrate can be designed in such a manner that the thickness of the line can be selected such that the line resistance by the Equation 1 is not increased, after deciding the length and the width of the line.

Figure 4A:
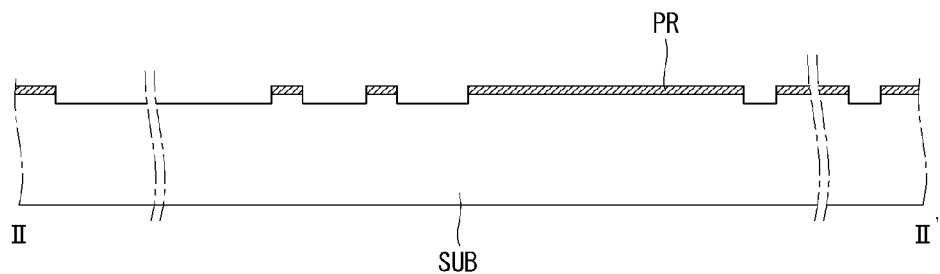
FIGS. 4A to 4E are cross-sectional views illustrating the steps of manufacturing for thin film transistor substrate having a low resistance bus line structure of FIG. 3 by cutting along the line II-II', according to present disclosure.

As shown in FIG. 4A, the etched line pattern of the glass substrate SUB can have depth of 4000 Å, at least, which is twice that of line thickness in the related art. In this case, the width of the line can be same and the length of the line can be twice that of the related art. Furthermore, the etched line pattern of the glass substrate SUB can have depth of 6000 Å, at least, which is three times the line thickness in the related art. In that case, the width of the line can be one half (50%) of the related art and the length of the line can be 1.5 times than the related art.

Figure 4B:
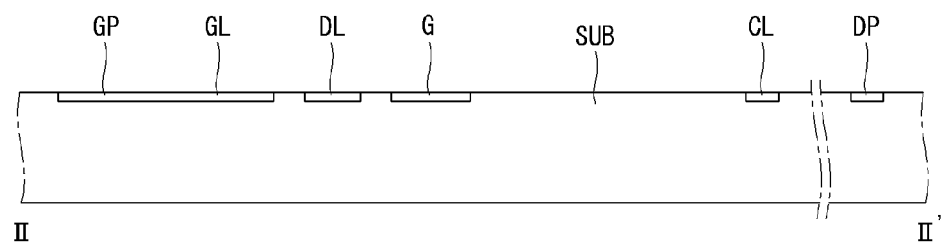

As shown in FIG. 4B, after etching the glass substrate SUB to have a line pattern, and in the state of having the photoresist PR on the glass substrate SUB, a metal for the bus line is deposited on the whole surface of the glass substrate SUB. Then, the metal is deposited on the photoresist PR and filled within the recessed groove of the line pattern formed on the glass substrate SUB. After that, using the lift-off process, the photoresist PR is removed. The metal only deposited on the photoresist PR is removed, but the metal filled into the recessed groove of the line pattern is remained. As a result, the lines are buried in the glass substrate SUB. The lines include the gate line GL extending in one direction on the glass substrate SUB, the common line CL parallel to the gate line GL, and the data line DL having a plurality of segments and extending in the other direction on the glass substrate SUB between the gate line GL and the common line CL. Particularly, the gate line GL and the data line DL are extending across each other. Furthermore, a gate electrode G is branched from the gate line GL to the pixel area. At one end of the gate line GL and at one end of the data line DL, a gate pad GP and a data pad DP are formed, respectively. Even though it is not shown in the drawings, at one end of the common line CL, a common pad can be formed.

Figure 4C:
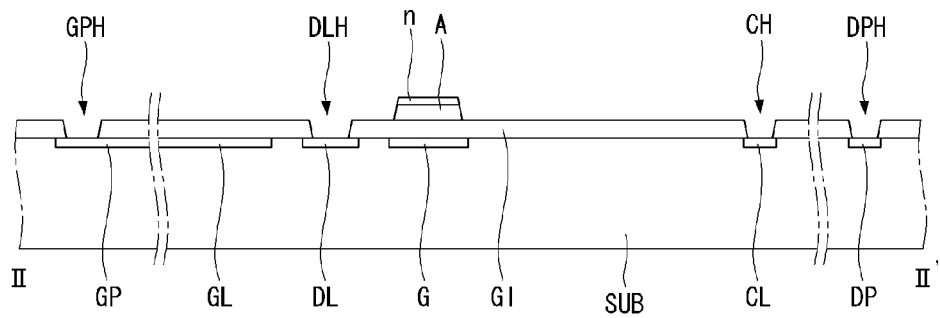

On the substrate SUB having lines, a gate insulating layer GI is formed by depositing an insulating material such as silicon nitride (SiNx) or silicon oxide (SiOx). After that, a semiconductor material such as amorphous silicon and an impurity dopped semiconductor material such as n+ dopped silicon are sequentially deposited thereon. By patterning the impurity dopped semiconductor material and the semiconductor material using a second mask process, a semiconductor channel layer A and an ohmic layer n are formed, as shown in FIG. 4C. The semiconductor channel layer A and the ohmic layer n overlap with the gate electrode G having the gate insulating layer GI therebetween. At the same time, by sequentially patterning the gate insulating layer GI, a gate pad contact hole GPH exposing some portions of the gate pad GP, a data pad contact hole DPH exposing some portions of the data pad DP, a data line contact hole DLH exposing both ends of the each data line DL formed in the segment shape, and a common line contact hole CH exposing some portions of the common line CL. To do so, over the gate electrode G, the semiconductor channel layer A and the ohmic layer n are formed, and at the other portions, the gate insulating layer GI is also patterned. Therefore, the second mask process could be performed using a half-tone mask preferably.

On the substrate SUB having the semiconductor channel layer A and the ohmic layer n, a source-drain metal is deposited. By patterning the source-drain metal using a third mask process, the source-drain elements are formed. The source-drain elements includes a source electrode S, a drain electrode D, a pixel electrode PXL, a common electrode COM, a gate pad terminal GPT, a data pad terminal DPT, and a data line connection terminal CN. The source-drain metal can include the molibdenium-titanium alloy (MoTi) of 200~300 Å thickness. Furthermore, the source-drain metal can include the copper (Cu) of 2000~3000 Å sequentially stacked on the molibdenium-titanium alloy (MoTi) of 200~300 Å thickness.

The source electrode S contacts one portion of the ohmic layer n to overlap with one side of the semiconductor channel layer A and the gate electrode G. The drain electrode D contacts anther portion of the ohmic layer n to overlap with the other side of the semiconductor channel layer A and the gate electrode G. The pixel electrode PXL is formed as one body with the drain electrode D, and has a plurality of segments disposed in parallel within the pixel area. The common electrode COM contacts the common line CL through the common contact hole CH, and has a plurality of segments disposed in parallel with each segment of the pixel electrode PXL within the pixel area. The pixel electrode PXL and the common electrode COM are disposed in parallel each other with a predetermined distance. Furthermore, the data line connection terminal CN physically and electrically connects the neighboring segments of the data line DL. That is, the one end of the one segment of data line DL exposed through the data line contact hole DLH is connected to the other end of the neighboring segment of data line DL exposed through the data line contact hole DLH. As shown in the FIG. 3, the source electrode S can be formed by branching from the data line connection terminal CN.

In this embodiment, the data line DL is formed at the same time for forming the gate line GL. In that case, the source-drain metal can comprise a single layer of the molibdenium-titanium alloy (MoTi). When the data line DL is formed by patterning the source-drain metal, it is preferable that the source-drain metal comprises the double layer in which the molibdenium-titanium alloy (MoTi) layer and the copper (Cu) layer are stacked. This is for ensuring the low resistance of the data line DL in the large area thin film transistor substrate. However, more preferably, the data line DL is formed with the gate metal when the gate line GL is formed, as this embodiment.

Figure 4D:
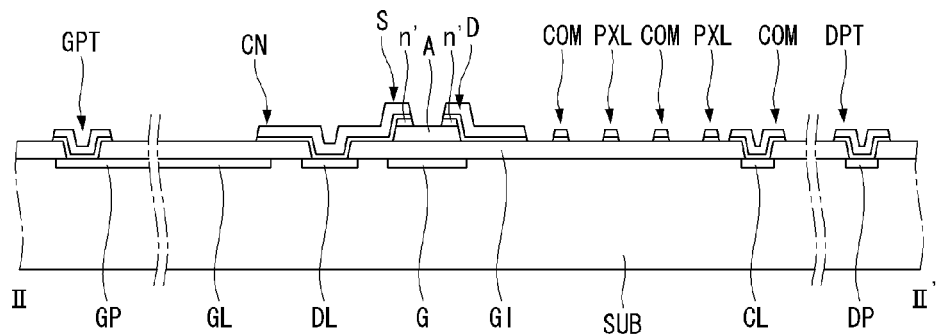

After that, further etching the ohmic layer n using the source-drain elements as a mask, the portions of the ohmic layer n exposed between the source electrode S and the drain electrode D are removed so that the semiconductor channel layer A is exposed between the source electrode S and the drain electrode D. Consequently, the thin film transistor TFT including the source electrode S, the drain electrode D, the semiconductor channel layer A, and the gate electrode G is completed, as shown in FIG. 4D.

Figure 4E:
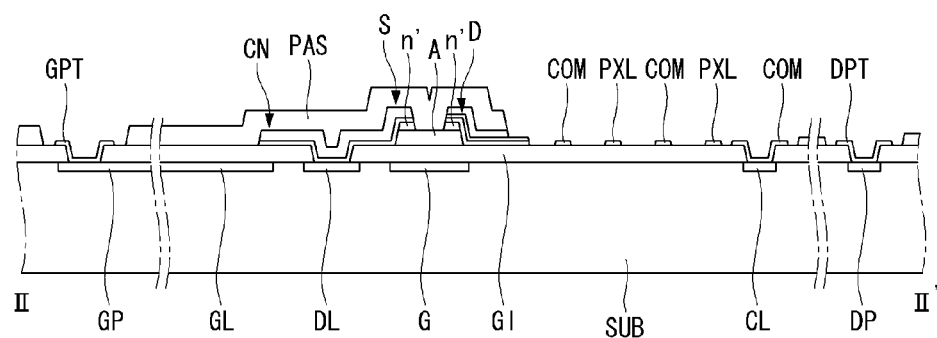

On the whole surface of the substrate SUB having the source-drain electrodes S and D, the pixel electrode PXL, and the common electrode COM, a passivation layer PAS is formed by depositing an insulating material such as silicon nitride (SiNx) or silicon oxide (SiOx). As shown in FIG. 4E, by patterning the passivation layer PAS using the fourth mask process, the whole of the gate pad terminal GPT and the data pad terminal DPT are exposed. As the gate pad terminal GPT and the data pad terminal DPT are for receiving electrical signal from external control devices, they should be exposed.

In addition, if required, some portions of passivation layer PAS covering the pixel area may be removed. In that case, the copper (Cu) layer forming the upper layer of the pixel electrode PXL and the common electrode COM would preferably be removed. The reason for removing the exposed copper layer is that as the copper layer has some thousands Å which is much thicker than the molibdenium-titanium alloy layer of some hundreds Å, the step difference is high so that the alignment layer deposited thereafter may be damaged due to the step difference. The other reason is that the copper layer is for reducing the line resistance so that it is not required to remove the pixel electrode PXL and common electrode COM. When removing the exposed copper layer, the copper layer of the exposed gate pad terminal GPT and the exposed data pad terminal DPT is also removed. When a copper layer is exposed at the terminals for contacting with external devices, it causes oxidation of the copper layer and further it causes defects of the connection at the terminals. Therefore, removing the copper layer can improve the electrical reliablity of the device.

Not shown in figures, when source-drain metal comprises the single layer of molibdenium-titanium alloy layer, the passivation layer PAS covering the pixel area would not be removed, but the gate pad terminal GPT and the data pad terminal DPT are exposed only.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A method for manufacturing a thin film transistor substrate having a low resistance bus line structure comprising:
    forming bus lines by etching a surface of a substrate to form bus line patterns and filling the bus line patterns with a bus line metal;
    forming a semiconductor channel layer at one portion of a pixel area defined by the bus lines; and
    forming source-drain electrodes on the semiconductor channel layer, a pixel electrode extending from the drain electrode within the pixel area, and a common electrode parallel with the pixel electrode,
    wherein forming the bus lines includes forming a data line having a plurality of segments perpendicular to the gate line between the gate line and the common line, the data line is buried into the substrate,
    wherein forming the bus lines further includes forming the gate line extending in one direction on the substrate, the common line extending parallel with the gate line, and a gate electrode branching from the gate line to the pixel area, wherein forming the semiconductor channel layer includes:

forming the semiconductor channel layer overlapping with the gate electrode, by sequentially depositing an insulating material, a semiconductor material and an impurity dopped semiconductor material and patterning the impurity dopped semiconductor material and the semiconductor material; and forming a gate pad contact hole exposing a gate pad, a data pad contact hole exposing a data pad, a common line contact hole exposing some portions of the common line, and data line contact holes exposing both ends of the segments of the data line, by sequentially patterning the insulating material.

2. The method according to the claim 1, wherein the forming the bus lines further includes:

depositing a photoresist on the substrate;

patterning the photoresist using a mask corresponding to the bus line patterns;

etching the surface of the substrate using the patterned photoresist to form the bus line patterns to the substrate;

depositing the bus line metal on the photoresist and filling the bus line metal in the bus line patterns; and removing the photoresist with the bus line metal on the photoresist.

3. The method according to the claim 1, wherein the forming the source-drain electrodes, the pixel electrode and the common electrode includes:

depositing and patterning a source-drain metal on the substrate having the semiconductor channel layer to form the source electrode on one side of the semiconductor channel layer, the drain electrode facing the source electrode on the other side of the semiconductor channel layer, the pixel electrode extending from the drain electrode and having a plurality of segments disposed in parallel in the pixel area, the common electrode connecting to the common line via the common line contact hole and having a plurality of segments disposed in parallel in the pixel area; and further to form a gate pad terminal contacting the gate pad via the gate pad contact hole, a data pad terminal contacting the data pad via the data pad contact hole, and a data line connecting terminal connecting to neighboring segments of the data line via the data line contact holes.

4. The method according to the claim 3, further comprising:

forming a passivation layer exposing the gate pad terminal and the data pad terminal by depositing and patterning a passivation material on the substrate having the source-drain electrodes, the pixel electrode and the common electrode.

5. The method according to the claim 4, wherein the source-drain metal is deposited by sequentially depositing a first metal layer and a second metal layer, and wherein the passivation layer is further patterned corresponding to the pixel area to expose the pixel electrode and the common electrode; and further comprising:

removing the second metal layers of the gate pad terminal, the data pad terminal, the pixel electrode and the common electrode.

6. The method according to the claim 5, wherein the first metal layer includes at least one of molibdenium, titanium and molibdenium-titanium alloy, and the second metal layer includes copper.

7. A thin film transistor substrate having a low resistance bus line structure comprising:

a substrate;

bus line patterns recessed into the substrate with a predetermined depth;

bus lines filling in the bus line patterns;

a gate insulating layer covering the bus lines;

a thin film transistor disposed at one portion of a pixel area defined by the bus lines;

a pixel electrode connecting to the thin film transistor and having a plurality of segments parallel to each other in the pixel area;

a common electrode including a plurality of segments parallel with the segments of the pixel electrode in the pixel area, wherein the bus lines includes a data line having a plurality of segments perpendicular to a gate line between the gate line and a common line, the data line is buried into the substrate, wherein the bus lines include the gate line extending in one direction on the substrate, the common line extending parallel with the gate line; and the thin film transistor includes a gate electrode branching from the gate line, a semiconductor channel layer overlapping with the gate electrode, a source electrode connecting to one side of the semiconductor channel layer, and a drain electrode facing with the source electrode and connecting to the other side of the semiconductor channel layer, a gate pad formed at one end of the gate line, a gate pad contact hole exposing the gate pad, and a gate pad terminal contacting to the gate pad via the gate pad contact hole;

a data pad formed at one end of the data line, a data pad contact hole exposing the data pad, and a data pad terminal contacting to the data pad via the data pad contact hole; and data line contact holes exposing both ends of the segments of the data line, and a data line connecting terminal connecting to neighboring segments of the data line via the data line contact holes.

8. The device according to the claim 7, further comprising:

a passivation layer on the substrate exposing the gate pad terminal, the data pad terminal, the pixel electrode and the common electrode.

9. The device according to the claim 8, wherein the source electrode and the drain electrode include a first metal layer and a second metal layer, and the exposed gate pad terminal, the data pad terminal, the pixel electrode and the common electrode have a first metal layer only.

10. The device according to the claim 9, wherein the first metal layer includes at least one of molibdenium, titanium and molibdenium-titanium alloy, and the second metal layer includes copper.

* * * * *